United States Patent [19]

Seely et al.

[11] 3,836,862

[45] Sept. 17, 1974

[54] FIELD EFFECT TRANSISTOR LINEAR AMPLIFIER WITH CLOCKED BIASING MEANS

[75] Inventors: John Leland Seely, Northport, N.Y.; Frank M. Wanlass, Cupertino, Calif.

[73] Assignee: General Instrument Corporation, Newark, N.J.

[22] Filed: Aug. 14, 1972

[21] Appl. No.: 280,534

[52] U.S. Cl. ........................ 330/25, 330/22, 330/35, 330/86

[51] Int. Cl. ........................ H03f 3/16

[58] Field of Search ............... 330/22, 25, 35, 9, 86; 307/205, 214

[56] References Cited

UNITED STATES PATENTS

| | | | |
|---|---|---|---|
| 3,366,888 | 1/1968 | Kawashina et al. | 330/9 |
| 3,392,341 | 7/1968 | Burns | 330/35 X |
| 3,500,062 | 3/1970 | Annis | 307/205 X |
| 3,623,132 | 11/1971 | Green | 307/205 |
| 3,638,129 | 1/1972 | Pryor | 330/35 X |
| 3,696,305 | 10/1972 | Mitchell et al. | 330/35 X |
| 3,749,936 | 7/1973 | Bell | 307/205 X |

OTHER PUBLICATIONS

De Simone et al., "Mosfet Sense Amplifier with Low-input Impedances," IBM Technical Disclosure Bulletin, Vol. 14, No. 8, January 1972, pp. 2290,2291, 330-335.

*Primary Examiner*—Herman Karl Saalbach
*Assistant Examiner*—James B. Mullins

[57] ABSTRACT

A self-biasing MOS linear amplifier is provided with improved means for maintaining the circuit biased to its linear amplification range. That means comprises a clocked feedback FET operatively connected between the output and input terminals and adapted to charge a storage capacitor at the input during a first clock interval, the bias level applied at the input being a function of the operating characteristic of the switching FET. The storage capacitor is effective to maintain the device so biased throughout the remainder of the clock cycle.

In a second embodiment the circuit comprises a plurality of inverter stages, a single clocked feedback FET being operatively connected between the output and input terminals whereby the circuit is designed to stabilize in its operative linear amplification range during the first clock interval.

18 Claims, 3 Drawing Figures

FIELD EFFECT TRANSISTOR LINEAR AMPLIFIER WITH CLOCKED BIASING MEANS

The present invention relates to linear amplifiers and more particularly a self-biased field effect transistor amplifier.

Electronic amplifiers are basic circuit components utilized in a variety of applications. A major application of amplifiers in recent years is in computer circuitry where they serve to insure against loss of signal information by propagation delay or the like.

The insulated gate or metal oxide silicon transistor (MOSFET) was perhaps the earliest solid state amplifying device to be invented. However, it is only within recent years that the technology for making such structures has advanced sufficiently to make them commercially feasible. The MOSFET is a voltage controlled device that exhibits an extremely high input impedance and for that reason is particularly suitable as a high gain linear amplifier. In addition, the square law transfer characteristics of these devices makes them extremely attractive in amplifying circuits. Finally, by virtue of their extremely small size, low power requirements and ease of fabrication in large quantities on a single substrate of semiconductor material, they are particularly suitable for use in today's integrated circuit arrangements.

In the fabrication of such circuits, these transistors are formed on a chip of semiconductor material by performing appropriate operations on suitably doped regions of the semiconductor substrate to produce the basic elements of the individual field effect devices. A typical MOSFET (P channel enhancement mode) comprises an N-type silicon substrate with two highly doped P-type spaced regions diffused therein defining the source and drain. A thin layer of insulating material, typically silicon dioxide, is disposed over the silicon substrate between the source and the drain forming the gate dielectric, upon which the gate electrode is deposited.

In operation, the source is typically connected to the substrate and grounded. The drain is connected to a negative potential via a load resistor. The gate, which serves as a control electrode, is connected to the input signal. If the gate is at zero potential, no current flows from source to drain because the P-N junctions are reverse biased. However, as the gate is made more negative, more and more positively charged holes are induced into the region at the substrate surface (the channel) to compensate for the N-type doping of the substrate. When enough holes have accumulated in the channel region, the surface of the silicon changes from electron-dominated to hole-dominated material and is said to have inverted (i.e., the channel changes from N-type to P-type) and ohmic conduction occurs through the channel between source and drain. As the gate is made more negative, the inversion layer is driven deeper and conduction increases first rapidly then less rapidly and finally tends to level off at some high value (obeying a square law). The gate voltage at which conduction begins is known as the threshold voltage $V_T$ of the device.

$V_T$ is directly proportional to the doping level of the silicon under the gate oxide and is inversely proportional to the capacitance per unit area (i.e., oxide thickness). However, any net charge or polarization in the oxide or the oxide-silicon interface (surface state charge per unit area) will offset $V_T$. The variation of this trapped charge from one device to another and within a given device during operation is a primary drawback in the use of MOSFETs both for digital and linear applications. In recent years fabrication techniques have been developed to control variations in surface state density and thus threshold voltage to within reasonably small values. Nevertheless, even when fabricated by the present day processing techniques in a well controlled line, threshold voltage of MOSFETs typically vary as much as one volt for devices produced from different lots. While these small variations are acceptable in digital applications they normally cannot be tolerated in linear circuit applications which must operate fairly precisely in the linear portion of the transfer curve.

For example, in the typical MOSFET linear amplifier, the gate of the amplifying or driving device is typically biased to a normal threshold voltage by a constant D.C. source. Since this source does not take into account variations in threshold, such variations from device to device may result in an under or over biasing of the transistor to its fully off or fully on conditions, respectively. Moreover, during operation if external conditions cause the threshold to vary, the device may likewise be offset from the linear region of its transfer curve.

It has been suggested to bias the gate of an amplifying MOSFET by means of a highly resistive feedback from its drain. While such feedback circuits have been successful to some extent in reducing the effects of threshold drift, they have been found unsatisfactory in several respects. For low frequency applications, the feedback resistor must be extremely large in order to provide the required isolation between input and output. This requirement results in a significant increase in cost of fabrication and space required on the semiconductor substrate. In addition, the use of such large feedback resistors results in appreciable warm-up times, since after applying the supply voltage it takes several time constants for the bias to stabilize on the gate.

Finally, the use of a highly resistive feedback bias considerably reduces the ability of the circuit to detect input signals from high impedance sources such as capacitors while over voltages at the input tend to cause the amplifier stage to block.

It is a primary object of the present invention to provide an MOS linear amplifier circuit designed to accommodate considerable variations in threshold voltage thereby to automatically maintain the active amplifying device in the narrow linear region of its transfer curve.

It is another object of the present invention to design an MOS amplifier circuit with means for self-biasing the amplifying transistor to its linear operating region without the resulting drawbacks of prior art arrangements.

It is yet another object of the present invention to provide a self-biasing MOS amplifier which is adapted to detect signal voltages from high impedance sources and eliminate blocking due to over voltages and which may be easily integrated on the semiconductor chip at low cost in a small space with no additional processing steps.

To these ends the circuit of the present invention comprises an amplifying MOSFET in operative series circuit arrangement with a load resistor between a negative supply voltage and ground. The input signal to be amplified is applied to the gate terminal of the amplifying transistor and the output is taken at the junction between the load resistor and amplifying device (i.e., the drain terminal of the amplifying MOSFET). Accordingly, as the signal at the input goes negatively the drain current increases and the output is drawn towards ground. Conversely, as the input goes positively the drain current decreases and the output is drawn towards the negative supply. The circuit thus provides an inverted output in a manner well known in digital circuit applications.

In order to maintain the amplifying FET in its linear amplification range in accordance with the present invention, its gate terminal (input) is returned to its drain through the output circuit of a feedback MOSFET, the gate of that feedback FET receiving a suitable clock signal. A storage capacitor is connected between the gate and source (ground) of the amplifying FET. Accordingly, during the operative interval of the clock voltage the feedback FET is rendered conductive and is effective to charge the capacitor to the output signal level. In accordance with known principles that level stabilizes at a value slightly more negative than the threshold voltage of the amplifying FET, the exact level being determined by the size of the resistive load and the parameters of the amplifying FET. This value corresponds precisely to the active linear amplification region of the particular device and the gate of the amplifier is maintained at this nominal level by means of the storage capacitor. As a result, when the clock voltage is terminated the circuit is in condition to provide precise linear amplification of input signals applied to the gate.

The input terminal is typically isolated from the signal source by either a capacitor or switching device. The circuit therefore not only automatically compensates for variations in threshold voltage but also is adapted to detect voltages from high impedance sources and of a magnitude less than $V_T$.

To the accomplishment of the above and to such other objects as may hereinafter appear, the present invention relates to a self-biasing MOS amplifier as defined in the appended claims and as described herein in connection with the accompanying drawings, in which:

Figure 1:
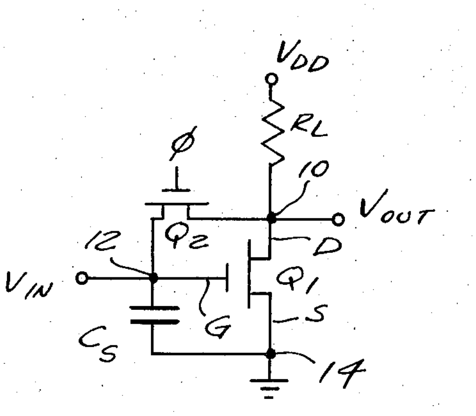
FIG. 1 is a circuit diagram showing the amplifier circuit of the present invention.

As illustrated in FIG. 1, the amplifying circuit of the present invention comprises a resistive load $R_L$ operatively connected in series with the output circuit of an amplifying FET Q1 between a negative voltage supply $V_{DD}$ and ground. The output $V_{out}$ of the amplifier is defined at node 10 at the junction between the resistor $R_L$ and FET Q1, the input $V_{in}$ signal being applied to the gate terminal G of FET Q1. A second FET Q2 has its output circuit operatively connected between the drain D of FET Q1 at node 10 and its gate terminal G at node 12, that FET Q2 having its gate terminal operatively connected to a suitable clock signal source $\phi$. A capacitive storage device Cs is operatively connected between the gate G of FET Q1 at node 12 and its source terminal S at node 14.

While the circuit here illustrated is designed for use with P channel enhancement mode MOS devices, it will be appreciated that the same principles apply equally to the use of N channel and/or depletion mode devices, the appropriate modifications of the circuit herein disclosed being within the skill of those versed in circuit design.

Circuit operation begins with the application of the negative clock voltage $\phi$ at the gate of FET Q2, that voltage being sufficient to render FET Q2 conductive whereupon the storage capacitor Cs is charged negatively from the $V_{DD}$ source through the resistor $R_L$. Since the resistance of FET Q2 in its conductive state is negligible, the voltage at nodes 10 and 12 stabilize at a particular value. That value must be less than $V_{DD}$ since the amplifying FET Q1 would conduct current causing a voltage drop across $R_L$. On the other hand, the voltage at nodes 10 and 12 must be at least as negative as the threshold voltage of the amplifying FET Q1 to provide any drain current at all through that device. As a result, nodes 10 and 12 are automatically biased to a value somewhere between the threshold voltage $V_T$ of FET Q1 and the negative voltage supply $V_{DD}$, the particular value being dependent upon the relative geometry and operating characteristics of FET Q1 and resistor $R_L$. For the typical amplifying FET, this value will be slightly above (more negative) than threshold voltage $V_T$ of the device, the region in which the device has appreciable small signal linear gain. Moreover, it will be appreciated that the FET Q1 will be automatically biased to a point of useful linear gain for virtually any value of the load resistor $R_L$.

The period of the clock signal $\phi$ is designed to permit storage capacitor Cs to be charged substantially fully to the value at node 10. Upon termination of the clock signal the feedback FET Q2 is rendered nonconductive and the input node 12 is isolated from the output node 10. However, because storage capacitor Cs maintains its charge, the gate of FET Q1 remains in the initial biasing condition thereby maintaining the device in its active linear amplification region. As a result, input signals applied to the gate G of FET Q1 are effective to provide a variation in drain current proportional to the input signal level whereby the input is inverted and amplified in a linear manner. That input signal is typically capacitively coupled to the input node 12 whereby small signal levels of a magnitude considerably less than the threshold voltage $V_T$ of the amplifying FET Q1 are easily detected (the storage capacitor Cs must be designed with a much smaller capacitance than the input capacitor). Moreover, because the effective resistance of the feedback FET Q2 is substantially infinite during the non-active phase of the clock signal $\phi$, the input capacitor (and storage capacitor Cs) may be made quite small without resulting in any appreciable low frequency degeneration. Indeed, the circuit is adapted to function quite well under D.C. operation, the storage capacitor Cs maintaining the gate G of FET Q1 centered reasonably precisely at its active amplification region. Moreover, over voltages on the input do not result in a blockage at the amplifier stage since the amplifier is effectively reset to its active operating region with each application of the clock pulse $\phi$.

Figure 2:
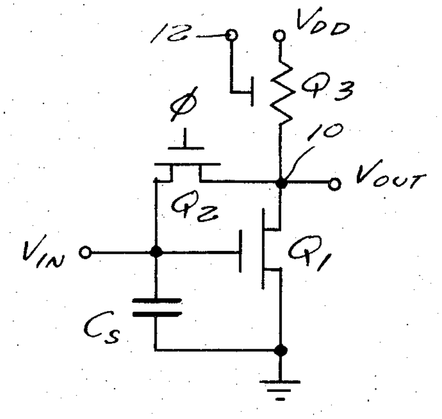
FIG. 2 is a circuit diagram of the circuit of FIG. 1 with the load resistor replaced by highly resistive MOSFET.

The load device $R_L$ may of course comprise a third MOSFET having an appropriately small channel width to length ratio and having its gate terminal returned to its drain, a configuration which is well known in the art. Alternatively, as illustrated in FIG. 2, the resistor $R_L$ may be replaced with a resistive MOSFET Q3 having a gate terminal G externally supplied at node 12 with either a D.C. or pulsed negative voltage.

Figure 3:
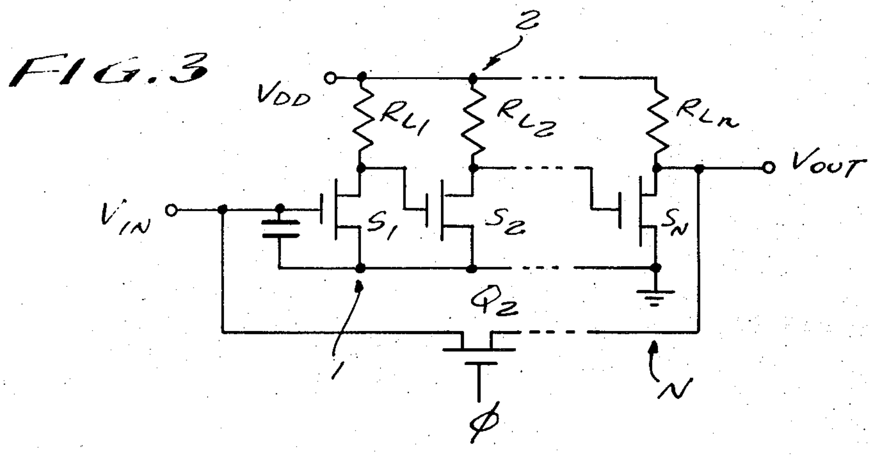
FIG. 3 shows the circuit of FIG. 1 implemented in a plurality of stages, a single feedback FET connecting the output and input.

FIG. 3 illustrates a practical high input impedance, low output impedance voltage amplifier comprising cascaded stages 1-N utilizing the principles of the present invention. Each stage comprises a load resistor $R_L$ operatively connected in series with the output circuit of an amplifying FET S between the $V_{DD}$ source and ground. The output of each stage is applied to the gate terminal of the amplifying FET of the succeeding stage. The capacitor Cs is operatively connected between the gate terminal of the FET S1 of the first stage and ground. A single feedback FET Q1 is operatively connected between the final output $V_{out}$ of the circuit and its input $V_{in}$. The circuit operates in a substantially identical manner to the single stage circuit illustrated in FIG. 1 with the exception that the bias voltage applied to the input during the clock signal $\phi$ is a function of the threshold voltages of all of the N amplifying FETs S. For example, if the switching device $S_N$ of the last stage of the circuit is initially nonconductive, the signal at the output terminal $V_{out}$ will be highly negative (close to the negative supply voltage $V_{DD}$) and the circuit is automatically self-biased as follows. During the operative clock pulse interval feedback FET Q2 is rendered conductive and the highly negative output signal is fed back and applied to the gate terminal of FET S1 at the input. That FET is accordingly rendered fully conductive whereby the output of the first stage is drawn towards ground and is effective to render the switching FET S2 in the next stage nonconductive. The signal is inverted from stage to stage in like manner with some degeneration in signal amplitude, the resulting signal at the gate terminal of FET $S_N$ in the last stage being effective to render that FET somewhat conductive to draw the output $V_{out}$ somewhat more positive. That change in the output signal $V_{out}$ in turn is effective to increase the resistance of the input FET S1 to draw the circuit still closer to its linear amplification range. Within a short period of time the circuit will stabilize in a condition in which it is effective to provide linear amplification of small signals applied at the input $V_{in}$, that condition being a function of the operating characteristics of FETs $S_1 - S_N$. The circuit is maintained so biased by the capacitor Cs operatively connected between the gate and source terminals of the input FET S1 after the termination of the operative portion of the clock signal $\phi$. When a large number of stages are provided in a circuit illustrated in FIG. 3, care must be taken in choosing the operating parameters of the devices therein to insure that the circuit does not oscillate.

It will be appreciated that we have provided an improved MOS linear amplifier including simple and reliable means to automatically bias the circuit to its operative linear amplification range. By utilizing a clocked feedback switch, the circuit here described provides reasonably precise initial biasing of the operative devices to the linear portion of their transfer curves at no significant increase in cost or space requirements without unduly limiting circuit operation to the high frequency range. The storage capacitor provided herein is effective to maintain the circuit to its initially biased condition throughout each clock cycle, the clocked feedback device being effective to reset the circuit periodically thereby to prevent blockage due to over voltages.

While only a limited number of embodiments of the present invention have been herein specifically described, it will be apparent that many variations may be made therein, all within the scope of the invention, as defined in the following claims.

We claim:

1. In a linear amplifier having an input terminal and an output terminal comprising a load device, a supply voltage and a first semiconductor switching device having a control terminal and an output circuit, said output circuit of said switching device being operatively connected in series with said load device across said voltage supply, said control terminal being operatively connected to said input terminal and said output terminal being operatively connected to the junction between said load device and said first switching device, the improvement comprising means for operatively connecting said output terminal to said input terminal during a first clock interval and for feeding back a portion of said supply voltage to said input terminal during said first clock interval and means for storing said portion of said supply voltage during said first clock interval and applying said stored portion of said supply voltage to said input terminal during a second clock interval to maintain the appropriate bias on said first switching device during said second clock interval, the magnitude of said portion of said supply voltage being dependent upon the operating characteristics of said first switching device and the resistance of said load device.

2. The linear amplifier of claim 1, wherein said first semiconductor switching device is a metal oxide silicon field effect transistor, said control terminal thereof comprising its gate and the output circuit thereof defined by its source and drain terminals, said portion of said supply voltage being a function of the threshold voltage of said field effect transistor.

3. The linear amplifier of claim 2, wherein said second semiconductor switching device comprises a second metal oxide silicon field effect transistor having its drain terminal connected to the drain terminal of said first field effect transistor and its source terminal operatively connected to the gate terminal of said first field effect transistor, said second field effect transistor being effective to reset said linear amplifier during each complete clock cycle, thereby to prevent blocking from over voltage at said input terminal.

4. The linear amplifier of claim 3, wherein said storage means comprises a storage capacitor operatively connected between the source and gate terminals of said field effect transistor.

5. The linear amplifier of claim 1, wherein said load device is a resistor.

6. The linear amplifier of claim 1, further comprising a second supply voltage, wherein said load device comprises a third semiconductor switching device having its output circuit operatively connected in series with said first semiconductor switching device and having a control terminal operatively connected to said second supply voltage.

7. The linear amplifier of claim 6, wherein said second supply voltage comprises a second source of a timed clock signal.

8. The linear amplifier of claim 6, wherein said first semiconductor switching device is a metal oxide silicon field effect transistor, said control terminal thereof comprising its gate and the output circuit thereof defined by its source and drain terminals, said portion of said supply voltage being a function of the threshold voltage of said field effect transistor.

9. The linear amplifier of claim 8, wherein said storage means comprises a storage capacitor operatively connected between the source and gate terminals of said field effect transistor.

10. The linear amplifier of claim 9, wherein said second supply voltage comprises a second source of a timed clock signal.

11. The linear amplifier of claim 8, wherein said second semiconductor switching device comprises a second metal oxide silicon field effect transistor having its drain terminal connected to the drain terminal of said first field effect transistor and its source terminal operatively connected to the gate terminal of said first field effect transistor, said second field effect transistor being effective to reset said linear amplifier during each complete clock cycle, thereby to prevent blocking from over voltage at said input terminal.

12. The amplifier of claim 1 wherein said storage means comprises a capacitor operatively connected to said control terminal of said first switching device, said capacitor having a value of capacitance such that, in conjunction with the magnitude of the said supply voltage, the resistance of said load device and the geometry and operating characteristics of said first switching device, it will charge through said feedback means during said first clock interval to a voltage level effective to bias said first switching device substantially to its operative linear amplification range and will substantially maintain said first switching device so biased during said second clock interval.

13. The linear amplifier of claim 12, wherein said first switching device comprises a field effect transistor having a source terminal and a gate terminal and wherein said storage means comprises a storage capacitor operatively connected between said source and gate terminals of said field effect transistor.

14. A linear amplifier having a supply voltage, an input terminal, an output terminal and a plurality of inverter stages, each such inverter stage comprising a semiconductor switching device having a control terminal and an output circuit, a load device, said output circuit of said switching device being connected in series with said load device across said voltage supply, the control terminal of the switching device of said first stage being operatively connected to said input terminal, the control terminals of the switching devices of succeeding stages being operatively connected to the junction between the switching device and load device of the preceding stage, said output terminal being operatively connected to the junction between said switching device and said load device of said last stage, and clocked feedback means for operatively connecting said output terminal and said input terminal during a first clock interval and effective to feed back a portion of said supply voltage to said input terminal during said first clock interval to automatically bias the switching device of said first stage to its linear amplification region, said portion of said supply voltage being dependent upon the operating characteristics of said semiconductor switching devices and the resistance of said load devices, and to thereafter isolate said input terminal from said output terminal during a second clock interval.

15. The linear amplifier of claim 14, further comprising capacitive storage means operatively connected to the control terminal of the switching device of said first stage and adapted to be charged to the level of said output signal during said first clock interval and to maintain said control terminal of the switching device of said first stage biased to said last mentioned level during said second clock interval.

16. The linear amplifier of claim 14, wherein said semiconductor switching device is a metal oxide silicon field effect transistor, said control terminal thereof comprising its gate and the output circuit thereof being defined by its source and drain, the output signal fed back to said input terminal during said first clock interval being a function of the threshold voltage of said field effect transistor.

17. The linear amplifier of claim 16, further comprising capacitive storage means operatively connected between the source and gate terminals of said field effect transistor.

18. In a linear amplification having an input terminal and an output terminal comprising a load device, a supply voltage and a semiconductor switching device having a control terminal and an output circuit, said output circuit of said switching device being operatively connected in series with said load device across said voltage supply, said control terminal being operatively connected to said input terminal, and said output terminal being operatively connected to the junction between said load device and said switching device, the improvement comprising clocked feedback means for operatively connecting said output terminal and said input terminal during a first clock interval and effective to feed back a portion of said supply voltage to said input terminal during said first clock interval, said portion of said supply voltage being dependent upon the operating characteristics of said semiconductor switching device and the resistance of said load device, and to thereafter isolate said input terminal from said output terminal during a second clock interval, whereby said control terminal of said switching device is automatically self-biased to its linear amplification region.

* * * * *